United States Patent [19]

Santoro

[11] 4,106,351

[45] Aug. 15, 1978

[54] MECHANICAL PUSHBUTTON DEVICES SUITABLE FOR RECORDING POSITIONS OF A MOBILE ELEMENT IN RELATION TO A FIXED SUPPORT

[76] Inventor: Giovanni Santoro, Via Gradoli 105, Roma, Italy

[21] Appl. No.: 713,129

[22] Filed: Aug. 10, 1976

[30] Foreign Application Priority Data

Aug. 11, 1975 [IT] Italy .............................. 50919 A/75

[51] Int. Cl.² .......................................... F16H 35/18
[52] U.S. Cl. ................................. 74/10.33; 74/10.31; 74/10.35; 74/10.37
[58] Field of Search ................. 74/10.33, 10.35, 10.37, 74/10.31, 425; 334/7

[56] References Cited

U.S. PATENT DOCUMENTS

| | | | |
|---|---|---|---|
| 2,253,433 | 7/1941 | Kellogg | 74/10.37 |
| 2,266,711 | 12/1941 | Crosby | 74/10.33 |
| 3,247,728 | 4/1966 | Wolf | 74/10.33 |
| 3,634,791 | 1/1972 | Yasuda | 74/10.33 |
| 3,863,509 | 2/1975 | Zimatore | 74/10.33 |
| 3,943,779 | 3/1976 | Ganderton | 74/10.35 |
| 4,020,704 | 5/1977 | Miyagi | 74/10.35 |

*Primary Examiner*—Benjamin W. Wyche
*Assistant Examiner*—R. C. Turner
*Attorney, Agent, or Firm*—DeLio and Montgomery

[57] ABSTRACT

A pushbutton control apparatus particularly suited for an automobile radio or the like. The position of a support member controls, e.g., the tuning of the radio. Preset recording elements fixed to the support member cooperate with respective pushbutton assemblies to move the support member to preselected positions when the individual pushbuttons are pressed. Apparatus is provided to preset the recording elements by allowing the angular position of a particular element to change with respect to the support member.

3 Claims, 5 Drawing Figures

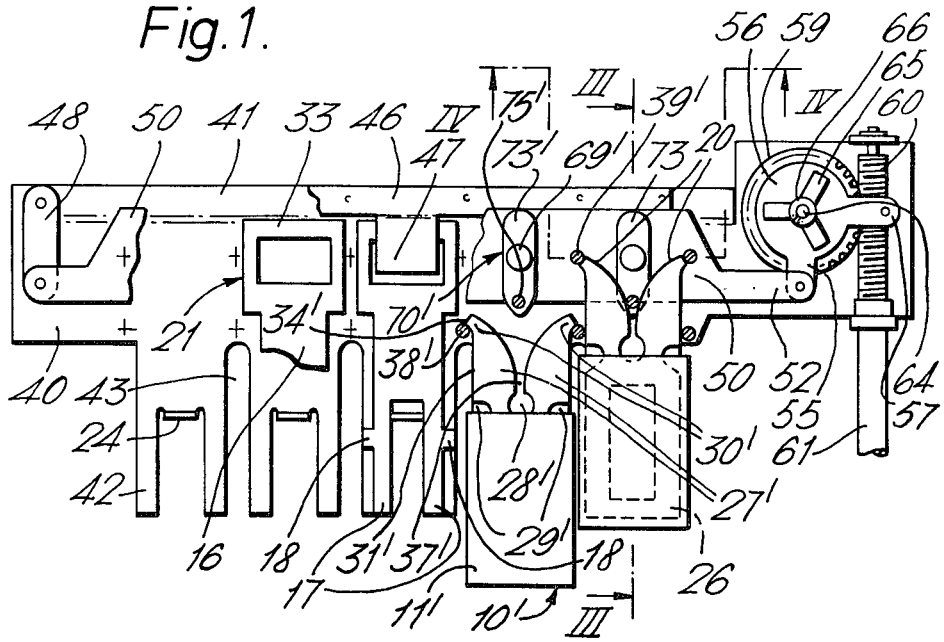
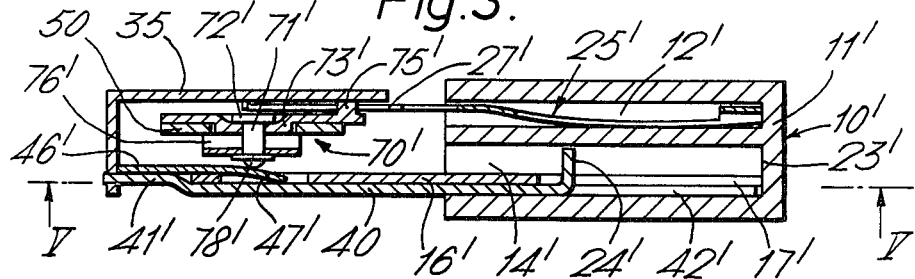
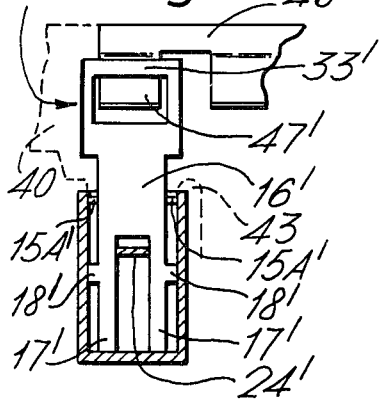

MECHANICAL PUSHBUTTON DEVICES SUITABLE FOR RECORDING POSITIONS OF A MOBILE ELEMENT IN RELATION TO A FIXED SUPPORT

The present invention is directed to a device controlled by pushbuttons suitable for recording a certain number of preselected positions. The positions are determined by an agent which in turn controls an external device (not shown) such as an electrical circuit capable of having variable characteristics according to the position assumed by the control agent. Such a device is particularly adapted to mechanically tune by means of a series of pushbuttons an apparatus supplied with a tuning circuit to a certain number of preselected frequencies, by pressing the pushbutton associated with the desired frequency. Such device may be specifically useful in, for example, the pushbutton control of an automobile radio.

Devices are known in the art by which it is possible to preselect, by means of recording the desired frequency associated with, for example, radio stations or the like, and establish a correspondence between the preselected frequencies and positions of the pushbutton control.

Such devices, however, generally lack precision, have a very awkward structure and are therefore ill-adapted to be included in devices having small dimensions, for example, automobile radios. They are furthermore very complicated and also costly.

Prior art devices also, because of the reduced precision, generally necessitate regulatory devices which result in a greatly complicated structure and notably increase the cost.

The present invention, on the other hand, furnishes apparatus of the type noted which has a very high precision, a very compact structure, is simple and very economical to produce and which does not require a regulatory device to overcome any lack of precision.

It is therefore an object of this invention to furnish apparatus to record a certain number of predetermined positions by a mobile control agent selectable by means of a pushbutton, the apparatus having a very compact and simplified structure, increased precision and reliability while functioning.

It is another object of the invention to furnish apparatus having very small dimensions capable of working effectively.

Yet another object of the invention is to furnish an apparatus in which it is unnecessary to use regulatory or retarding devices or mechanisms.

According to the present invention, and unlike the prior art devices, the recording elements controlled by the pushbuttons are positioned on a common bar and not on the pushbuttons themselves. The number of recording elements is to be the same as the number of pushbuttons.

Such an arrangement permits, as will become clearly evident from the following, the construction of the device capable of recording five or more positions with extreme efficiency and fidelity and which further is capable of being produced with incredibly reduced dimensions as regards space and depth.

A preferred embodiment of the invention will now be described, making reference to the accompanying drawings, which for the sole purpose of illustration, show a device for preselecting five transmitting stations in an apparatus for receiving radio waves.

In the drawings:

FIG. 1 is a top view of the preferred embodiment;

FIG. 3 is a section taken along line III—III of FIG. 1;

FIG. 4 is a fragmentary section taken along line IV—IV of FIG. 1;

FIG. 5 is a fragmentary section taken along line V—V of FIG. 3.

Figure 2:
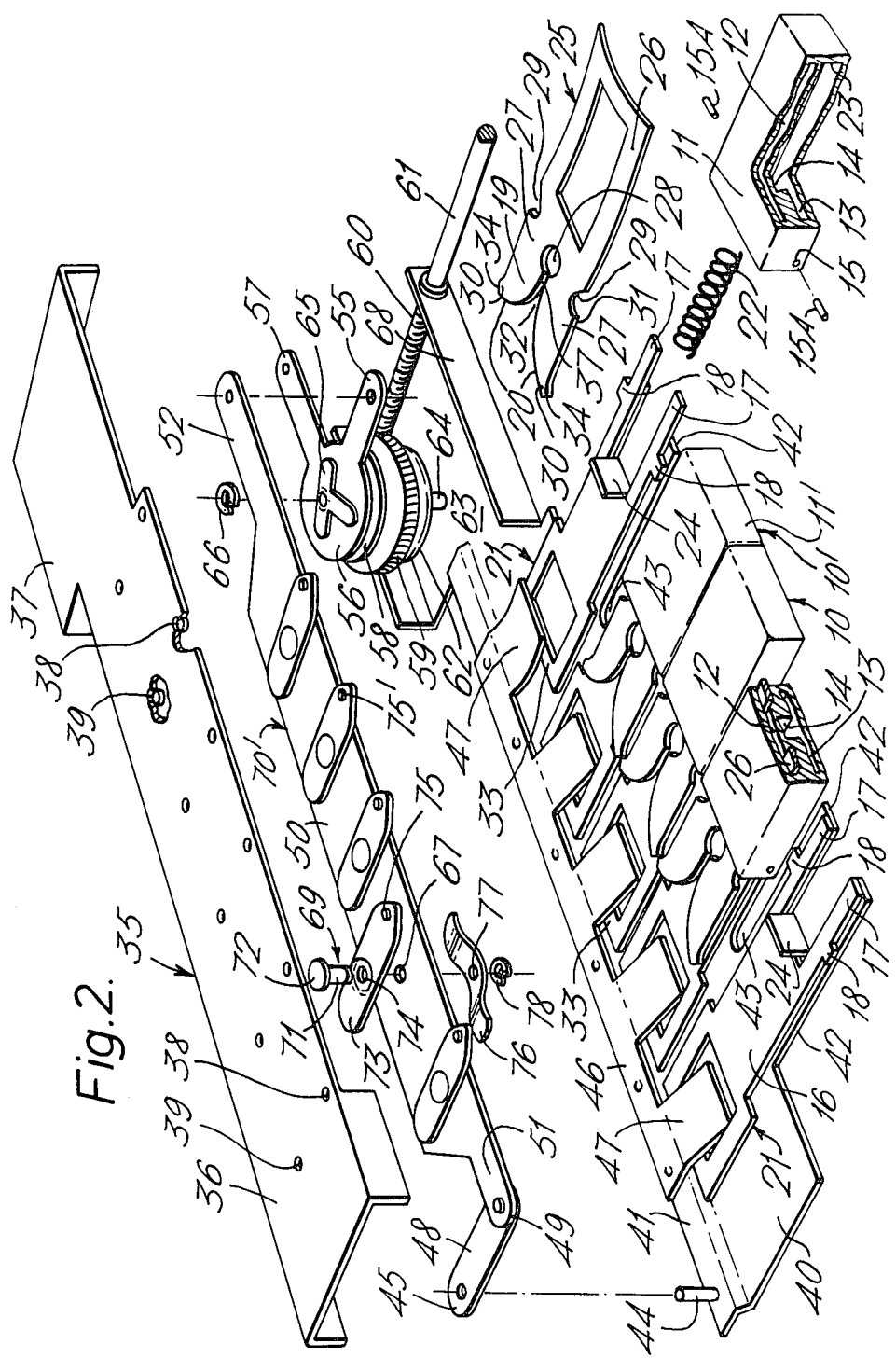
FIG. 2 is an exploded perspective view of the preferred embodiment of the invention.

The preferred embodiment of the invention includes essentially a plurality of key assemblies 10 for the preselection and the automatic tuning or synchronizing of the apparatus and the correspondence of the apparatus with an equal number of radio transmitting stations. The apparatus further includes an elongated supporting plate 50 carrying a number of recording elements 70 equal in number to the number of key assemblies 10, a tuning control wheel 63 suitably attached to both a control knob (not shown) and to the small support plate 50. The preferred embodiment is completed by suitable covering 35 and support 40 means.

Each key assembly, generally indicated by 10, includes a pushbutton 11 having two flattened slots or cavities 12 and 13 and an axial cavity 14. The pushbutton 11 further includes two openings 15 along the sides thereof each suited to receive a retaining pin 15a. Assembly 10 further includes a control plate 16. Control plate 16, which may be comprised of sheet metal pressed and cut in the proper shape, is formed having a first U-shaped end with arms 17. Control plate 16 further has a second end of a square frame 21 made in one piece and enclosed by a small end bar 33. Each of arms 17 has on the outside thereof, a horizontally disposed tooth 18.

Every key assembly 10 further includes a second control plate 25 having an inside part in the form of a rectangular frame and an outside part comprising two separate arms 27 having a circular hole 28 at their base. The two arms 27 further have two semi-circular cutouts 29 on the outside periphery of plate 25. The opposing edges 20 of arms 27 are curved inwardly towards each other, while the outer edges 31 are rectilinear and parallel. Arms 27 terminate in points 19 which include teeth 30 which are positioned slightly towards the outside. Arms 27 are provided with opening 28 and semi-circular notches 29 to permit elastic lateral deformation or bending. Edges 20 of needles 19 constitute arcs centered in opening 37, that is, at the narrowest point of aperture 32 at the exit of opening 28.

In the mounting of each key assembly 10 the two arms 17 of control plate 16 are inserted into housing 11 in cavity 13 disposed at the two sides of the axial cavity 14. Frame 26 is received in cavity 12 of housing 11. Frame 26 is curved so as to exert a strong frictional force against the walls of the cavity so that it may be retained therein. A helical spring 22 is positioned inside cavity 14 between the closed off rear 23 of the cavity and a tooth 24 drawn out of the base closure plate 40, as will be hereinafter described.

The key assemblies 10 and the other components of the preferred embodiment are positioned between a cover 35 and the aforesaid base closure plate 40.

Cover 35 has an elongated body 36 and a portion of increased width 37. It includes a series of six short anterior pins 38 and six similar rear pins 39 secured to cover 35 by semi-transverse shearing. The pins 38 and 39 are positioned on the underside of the elongated body 36 towards base plate 40.

The base plate has depending therefrom five pairs of arms 42, one pin provided for each key assembly 10. The arms are separated by slots 43 and further have, between each pair, the said teeth 24 folded back disposed orthogonally to base plate 40 at the base of each pair of arms 42.

When the apparatus is assembled, the arms of each pair of arms 42 extending from plate 40 are positioned parallel to and underneath arms 17 of control plate 16. Arms 17 are further aligned in cavity 13 of pushbutton 11 in such a way as to guide the latter in its running.

Base plate 40 further includes a small raised portion 41 on which is fixed, for example, a metal spring 46 having affixed thereto at spaced apart intervals leaves 47 slightly curved downwards towards base 40. Leaves 40 are of dimensions such as to be able to be interposed into each of the square openings in frames 21 of control plates 16.

An upwardly extending pivot 44 is provided at the left end of raised portion 41. One end 45 of a connecting rod 48 is pivoted on pivot 44. The other end of connecting rod 48 is pivotally attached to end 51 of the mobile support plate 50. Mobile support plate 50 has a second end 52 rotatably fastened to one arm 55 of wheel 56. Wheel 56 in turn has a second arm 57 spaced apart from first arm 55 by 90°. Second arm 57 is in turn attached by suitable means (not shown) to the mechanical control element of the electrical tuning circuit of the mechanism and to a visible index such as dial or the like.

Wheel 56 is further attached through a friction clutch indicated by 58 in FIG. 2 and to a detented wheel 59 which cooperates with an endless worm screw 60 which serves as the shaft of the handle useful for manually tuning the radio or otherise synchronizing the electrical device.

The wheel 56, friction clutch 58, detented wheel 59 and a second friction clutch 62 interposed between detented wheel 59 and base 64 are supported carefully by pivot 64 in such a way that they can rotate. Wheel assembly 63 rotates as a body when the component parts are pressed together by leaf spring 65 and held by clasp 66.

According to the invention, plate 50 serves to support in preselected positions the recording assemblies 70 of the preferred embodiment. Recording assemblies 70 each include a blocking pivot 69 having stems 71 and a head 72, a recording element 73 comprising a small plate of sheet metal having an elongated form and a central opening 74 and small short rungs 75 extending upwardly at the forward end of element 73 disposed towards pushbutton assembies 10. Recording assemblies 70 further include a leaf spring 76 having a central opening 77 and an elastic clasp 78 cooperable with a groove in the stem 71.

Each of the five recording assemblies 70 are mounted on plate 50 which has for this purpose five uniformly spaced-apart openings 57. Elements 73 are placed above plate 50 and metal spring 76 is placed below it with the stem 71 of blocking pivot 69 extending through holes 74, 67, and 77 in recording element 73, plate 50 and spring 76, respectively. Spring 76 is then blocked by elastic member 78 insertable into the groove in stem 71.

It is important to note that the spring 76 through clasp 78 and blocking pivot 69 exercises a strong pull on recording element 73 which is in close contact with the upper face of plate 50. Because of this, recording element 73 cannot normally turn around stem 71 of blocking pivot 69 because of the friction due to the surface contact.

Key assemblies 10 and plate 50 are so positioned between cover plate 35 and base plate 40 that a particular key assembly is located in juxtaposition with a particular recording assembly 70. Assemblies 10 and plate 50 are further positioned so that leaves 47 of spring 46 are juxtaposed the openings in frames 21 of control plates 16. The key assemblies are further placed so that plate 25, parallel to plate 16 but spaced thereabove at the level of rung 75 of recording element 73. The disposition is such that straight outer sides 31 of each arm 27 are in contact while running with the pair of small pins 38 protruding from the lower face of cover 35 in such a way as to be guided thereby.

Furthermore, the lower end of the retarding pivot 69 of each recording assembly 70 is in contact with and just above leaf 47 of the metal spring 46 so as to curve the spring downwardly and interpose it within the aperture in frame 21.

Leaf 47 is not essential; however, it insures that any thrust upon blocking pivot 69 by end 33 is exclusively axial and without lateral components.

Suppose by way of example that one desires that a receiving mechanism employing the device according to the invention be synchronized to the transmission frequency of a preselected transmitting station. For example, suppose that it is desired to synchronize a station with the second pushbutton from the right in FIGS. 1 and 2, that is, the pushbutton indicated by 11' in these figures and belonging to the key assembly 10', which is also shown in FIGS. 3, 4 and 5 for clarity of illustration.

One must first tune the apparatus to the station by means of the knob (not shown) associated with shaft 61. By way of example, suppose that to secure it the knob must be rotated; in such a case wheel 59, screw 60 and wheel 56 are also rotated.

The rotation of wheel 56 will also determine a lateral shift in the direction of the arrow F of plate 50 and therefore a similar shift of the recording assembly 70' supported by it, the shift being in relation to the base plate 40, to cover plate 35 and therefore a shift in relation to key assemblies 10, which are fixed.

The lateral shifting of plate 50 will displace laterally recording assembly 70' with respect to the corresponding key assembly 10' and rung 75' will no longer be centered with respect to opening 32' between the arms 27' of plate 25'.

To select a station, at this point it is necessary to pull out key 11'. Plugs 15a' and teeth 18' will cooperate to draw plate 16' with pushbutton 11', which will pull in turn small bar 33' of frame 21' and carry it to position beneath small leaf 47'. This operation serves to raise leaf 47' and press blocking pivot 69' upwards, compressing metal spring 76'. This serves to release recording assembly 70 with the consequence that key 72' will no longer force recording elements 73' to close frictional contact against the upper face of plate 50' thereby permitting the rotation of element 53' around stem 71' of blocking pivot 69'.

It is to be noted that when key assembly 10' is pulled outwardly, the outward movement of plate 25 is arrested by teeth 30' of arms 27' which come to abut the forward pair of studs 38 extending downwardly from the lower face of cover 36. Concurrently, pushbutton 11 will draw out plate 16' which is arrested in its movement by tooth 24' which is affixed to base plate 40.

When pushbutton 11' is pushed inwardly, thereby carrying with it plate 25', which will also serve to compress spring 22' between base 23' and tooth 24', recording element 73' and specifically rung 75' thereof will be positioned along curve 20' of one of the arms of plate 25', in particular here the right arm given the shift of plate 50 in the direction of arrow F.

The longitudinal shift of plate 25 will be stopped when the tips 34 of points 19' of arms 27' come to rest against small members 39'.

Since recording element 73' is now free to rotate under the thrust exercised by curved side 20' on small member 75' it will rotate recording member 75' clockwise as seen from above in such a way as to exactly center member 75' at the narrowest point 37' in opening 32' between arms 27'. Subsequent forward movement on pushbutton 11' will further cause control plate 16 now to shift toward the inside causing small bar 33 to slip beyond leaf 47' thereby freeing spring 76' and blocking pivot 69' to lower and block the rotation of recording element 73' in respect to angular movements against plate 50. The recording element 73' will be blocked, however, in the rotated position previously imposed thereupon by plate 25'.

In particular, with reference to FIG. 4, it is to be noted that blocking pivot 69' of recording assembly 70' becomes elevated due to small bar 33' through leave 47'. Thus, when bar 33' is removed, spring 76' through element 78' forces blocking pivot 69' to return to its lowered position blocking the rotation of recoring element 73'.

When the pressure on pushbutton 11' is released, compression spring 22' will force it back into its initial position in which the plugs 15a' push against teeth 18' of arms 17'.

Assuming now to have successfully tuned the apparatus into a second station, (manually or by means of another key) to tune it again to the station now associated with pushbutton 11' it will be sufficient to depress pushbutton 11'.

In fact, the thrust toward the inside on the pushbutton 11' will cause contact of rung 75 on recording element 73' with one of the curved sides 20' of arms 27' on plate 25'. Because of the lateral shift of the recording element 73' with respect to the center 37' of aperture 32', the shift will be determined by the position of the second station with respect to the desired station associated with pushbutton 11'. The force associated with the curved side 20' on small ring 75' will tend to carry this last into the position established with respect to the aperture 32', but since the element 73' cannot rotate with respect to plate 50 because of the pressure exercised by the blocking pivot 69', rung 75' will be forced to shift laterally drawing with it recording element 73' and plate 50 and causing a corresponding rotation of wheel 56 by which the small rung 75' is drawn into the narrowest point 37' of aperture 32'. The positioning of plate 50 relative to the first station associated with pushbutton 11' will cause the tuning circuit of the apparatus attached as above indicated to the wheel 56 to be again tuned to the desired station while on release of the pressure exercised on pushbutton 11' the spring 22' will force pushbutton 11' to return to its initial position.

It is to be noted that while the rotation of detented wheel 59 is blocked by endless screw 60, wheel 56 will rotate due to the presence of friction clutch 58.

The above-described operation with respect to pushbutton 11' and key assembly 10' can now be carried out with respect to the other four keys with four other transmitting stations in such a way to tune each station by pressing the corresponding key.

The herein described apparatus is quite precise in its ability to tune to a particular station without the aid of regulatory devices or the like. The particular structure of arms 27 including the opening 28, the semicircular notches 29 and the form of rims 34 at the end of points 19 permits, in whatever condition, the exact lateral displacement of the corresponding recording element 73 and therefore plate 50 on the pressing of pushbutton 11 of the particular key assembly 10.

Suppose for example that the force on pushbutton 11 by rung 75 be lateral in the direction from the left toward the right beyond what can normally be assimilated by the apparatus. Such a thrust will cause pushbutton 11 and therefore plate 25 to rotate slightly. Because of this needles 19 and hence narrow portion 37 will be displaced laterally as will be needle 19 which determines the positioning of ring 75.

The lateral displacement of key assembly 10 may determine an equal lateral displacement of the small rung 75 of the associated recording element 73 and therefore of plate 50 with a consequent error in the synchronization of the tuning circuit of the apparatus on the previously selected station. The particular structure of arms 27 on the other hand and the presence of small pins 39 against which the recording needles 19 come to rest, perform in such a way that the recording needles 19 of the aperture 32 on plate 25 find themselves at the end of their running exactly in the desired synchronized position, whereby small rung 75, and hence recording element 73 and plate 50 are in the tuned position, angularly and laterally, for the desired station.

In particular, the structure of arms 27 is such that when the pushbutton 11 is pressed either to synchronize a station or to tune the apparatus to the station after it has been synchronized, when the plate 25 reaches the end of its course the ends of the needles 19 always come to rest against both small rungs 39. This causes the needles 19 to be forced together slightly, thereby forcing element 75 towards the center 37, which constitutes the tuned position for the desired station.

This precision of synchronization has never been reached heretofore as will become evident to the person expert in this field.

It is to be understood that regarding the invention described and illustrated it can be modified and changed in the component parts non-fundamental within limits and in keeping with concepts of the invention itself.

What is claimed is:

1. Pushbutton control apparatus comprising:
    pushbutton key assembly means actuable along a first direction, said pushbutton key assembly means including a housing having a first cavity and a second cavity, first control plate means associated with said first cavity for guiding said pushbutton key assembly means, said first control plate means having a first end and a second end, said first end being U-shaped and having at least one tooth toward the outside of each arm thereof, and said second end having a completely enclosed aperture, said pushbutton key assembly means further including second control plate means;
    support means movable relative to said pushbutton key assembly means along a second direction at a substantial angle to said first direction;

recording element means affixed to said support means and cooperable with said second control plate means to move said support means to a preselected position relative to said pushbutton key assembly means when said pushbutton key assembly means is actuated; and blocking pivot means and resilient spring means for affixing said recording means to said support means in close frictional contact therewith to normally prevent said recording means from rotating.

2. Pushbutton control apparatus comprising:

pushbutton key assembly means actuable along a first direction, said pushbutton key assembly means including a housing having a first cavity and a second cavity, first control plate means associated with said first cavity for guiding said pushbutton key assembly means, and second control plate means having a first end retained by said second cavity and a second end having a centrally disposed slot that broadens toward the outside to form two needles, one on each side of the slot, each having an outwardly flaring tip;

support means movable relative to said pushbutton key assembly means along a second direction at a substantial angle to said first direction;

recording element means affixed to said support means and cooperable with said second control plate means to move said support means to a preselected position relative to said pushbutton key assembly means when said pushbutton key assembly means is actuated; and blocking pivot means and resilient spring means for affixing said recording means to said support means in close frictional contact therewith to normally prevent said recording means from rotating.

3. Apparatus as defined in claim 1 further comprising a second support, a leaf spring extending from said second support over at least a portion of said first control plate means and depending into said aperture, said blocking pivot means having a member depending therefrom in contact with the portion of said leaf spring depending into said aperture.

* * * * *